(12) United States Patent
Synder et al.

(10) Patent No.: US 8,525,511 B2
(45) Date of Patent: Sep. 3, 2013

(54) TIME DIVISION MULTIPLEXED DETECTOR FOR A MAGNETO-OPTICAL CURRENT TRANSDUCER

(75) Inventors: Robert M. Synder, Greensburg, PA (US); Lenny Roland, Greensburg, PA (US); Robert C. Miller, Alexandria, PA (US); Anton Poeltl, Hempfield, PA (US); Michael Mendik, Claridge, PA (US)

(73) Assignee: ABB Technology AG, Zurich (CH)

( * ) Notice: Subject to any disclaimer, the term of this patent is extended or adjusted under 35 U.S.C. 154(b) by 577 days.

(21) Appl. No.: 12/517,899

(22) PCT Filed: Dec. 11, 2007

(86) PCT No.: PCT/US2007/025265
§ 371 (c)(1),
(2), (4) Date: Nov. 5, 2010

(87) PCT Pub. No.: WO2008/073391
PCT Pub. Date: Jun. 19, 2008

(65) Prior Publication Data
US 2011/0052187 A1    Mar. 3, 2011

Related U.S. Application Data

(60) Provisional application No. 60/874,353, filed on Dec. 12, 2006.

(51) Int. Cl.
*G01R 31/00* (2006.01)
(52) U.S. Cl.
USPC .......................... 324/96; 324/244.1; 356/364

(58) Field of Classification Search
USPC .................... 324/96, 244.1, 227.14
See application file for complete search history.

(56) References Cited

U.S. PATENT DOCUMENTS

| | | | | |
|---|---|---|---|---|
| 3,753,101 A | * | 8/1973 | Aumont | 324/96 |
| 4,564,754 A | * | 1/1986 | Sato et al. | 250/225 |
| 4,916,387 A | | 4/1990 | Miller | |
| 5,844,409 A | * | 12/1998 | Bosselmann et al. | 324/96 |
| 6,154,022 A | * | 11/2000 | Willsch et al. | 324/96 |
| 6,208,129 B1 | * | 3/2001 | Willsch et al. | 324/96 |
| 6,515,467 B1 | * | 2/2003 | Bosselmann et al. | 324/96 |
| 6,952,107 B2 | * | 10/2005 | Rahmatian | 324/97 |
| 7,075,286 B2 | * | 7/2006 | Bohnert | 324/96 |
| 8,153,956 B2 | * | 4/2012 | Goldner et al. | 250/227.14 |

FOREIGN PATENT DOCUMENTS

EP 0919790  6/1999
WO PCT/US2007/025265  7/2008

* cited by examiner

Primary Examiner — Richard Isla Rodas
(74) *Attorney, Agent, or Firm* — Michael M. Rickin; Michael C. Prewitt; Denis Ticak

(57) ABSTRACT

A system monitors alternating current and includes a magneto-optical current transducer (MOCT) adapted to modulate an optical signal corresponding to magnitude of the alternating current. Beam splitters are in communication with the MOCT which are in turn connected to respective channels. Each channel includes an LED that is powered by a constant current source.

10 Claims, 3 Drawing Sheets

TIME DIVISION MULTIPLEXED DETECTOR FOR A MAGNETO-OPTICAL CURRENT TRANSDUCER

CROSS REFERENCE TO RELATED APPLICATION

This application claims priority from U.S. Provisional Application No. 60/874,353 filed on Dec. 12, 2006, entitled "Time Division Multiplexed Detector For A Magneto-Optical Current Transducer (MOCT)" the contents of which are relied upon and incorporated herein by reference in their entirety, and benefit of priority under 35 U.S.C. 119e is hereby claimed.

FIELD OF THE INVENTION

This invention relates to the sensing of high voltage currents and more particularly to the sensing of such current using a MOCT.

DESCRIPTION OF THE PRIOR ART

Magneto-Optical Current Transducers (hereinafter "MOCT") are used at electricity transmission substations to sense current in high voltage applications. One example of the use of a MOCT to sense such current is described in U.S. Pat. No. 4,916,387 ("the '387 patent"). The '387 patent describes the use of a time division multiplexed system ("TDM System") using a MOCT for sensing the high voltage current.

In the system of the '387 patent, each of the PIN diodes 28 and 30 have a fixed bias current and thus the light emitted by the associated LED 24 and 26, respectively, must be varied so that the current representative of the light detected at the associated PIN diode offsets the bias current. Thus each of the channels in the system of the '387 patent do not operate at the maximum signal to noise ratio at all times regardless of the attenuation in the fiber optic loop.

Thus it is desirable to have a TDM System that uses a MOCT for sensing high voltage current that substantially reduces the disturbances in the output waveform of the processing board caused by the vibration of the fiber optic cables in the system, whose channels at all times operate at the maximum signal to noise ratio and whose accuracy is not affected by the light that has not passed through the MOCT, which light for ease of description will be referred to hereinafter as back-reflected light. The system of the present invention accomplishes that.

SUMMARY OF THE INVENTION

According to one embodiment of the present invention a system is provided that monitors an alternating current. The system includes a magneto-optical current transducer adapted to modulate an optical signal corresponding to the magnitude of the alternating current. The transducer includes a first output and a second output and a first input and a second input. A first and a second beam splitter are in communication with the first and the second output respectively. A first and a second channel are in communication with the first and the second beam splitter respectively. The first channel includes a first LED and the second channel includes a second LED. The first LED is in communication with the first beam splitter and the second LED is in communication with the second beam splitter. The first channel includes a first output and the second channel includes a second output. A difference amplifier is connected to the first and the second channel outputs to subtract the first and the second channel outputs from one another to eliminate vibration induced disturbance. The first and said second LEDs are powered by a constant current source.

DETAILED DESCRIPTION

Figure 1:
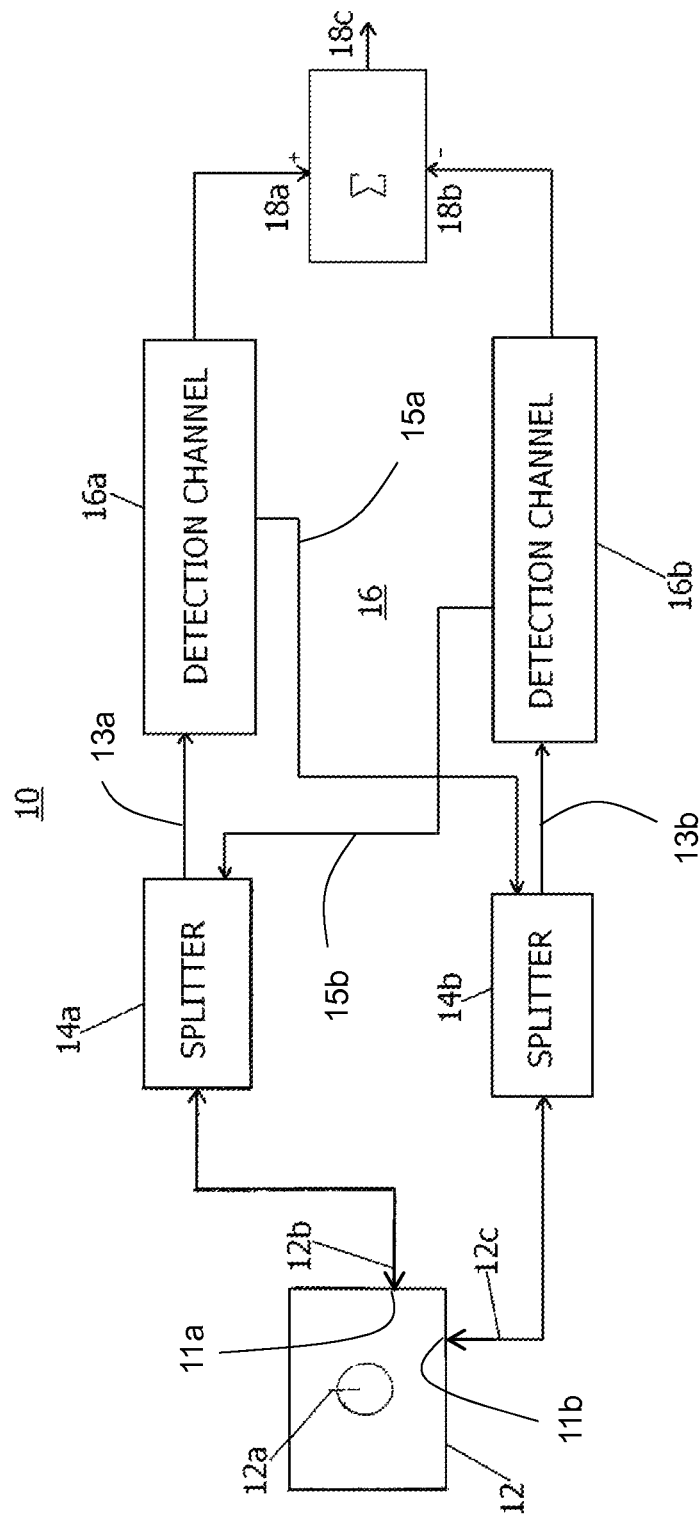
FIG. 1 shows a block diagram of the system of the present invention.
Figure 2:
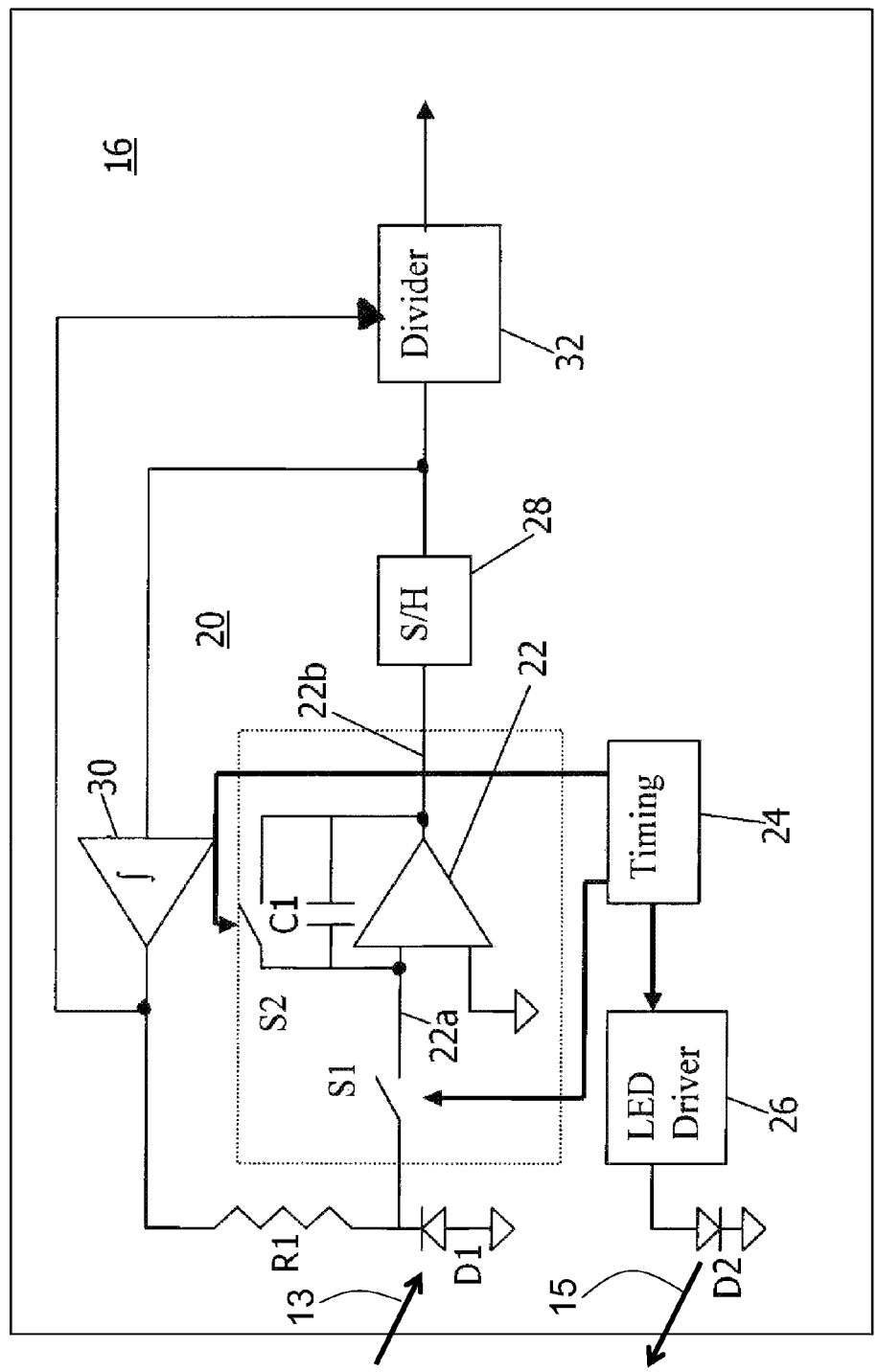
FIG. 2 shows a block diagram for one of the two identical channels in the system shown in FIG. 1.

Referring now to FIG. 1, there is shown in block diagram form the system 10 of the present invention. System 10 includes MOCT 12 which modulates optical signals 12b and 12c received from one of the splitters 14a and 14b at one of the input/outputs 11a and 11b, and emits the modulated optical signal 12b and 12c representative of the sensed high voltage current from the other of the input/outputs 11a and 11b to an associated one of beam splitters 14a and 14b. While the MOTC 12 includes combined input/output 11a and 11b, suitable inputs and outputs can be separate. Each beam splitter 14a and 14b is connected to an associated one of opposing channels 16a and 16b of detector 16, thereby providing the outputs 13a and 13b of the beam splitters 14a and 14b to the respective PIN diodes D1 of the detection channels 16a and 16b shown in FIG. 2. The beam splitters 14a and 14b also receive LED output 15b and 15a, respectively, from LED D2 in the opposing channels 16b and 16a, respectively. Each of the opposing channels 16a and 16b are identical and one example of an embodiment in accordance with the present invention of the channels 16a and 16b is shown in FIG. 2 which is described below. For ease of illustration the back reflected light is not shown in FIG. 1.

Each of the channels 16a and 16b pass light through the optical sensor (MOCT) 12 for a short sample period alternately in opposing directions. The physical parameter to be measured, the current through the MOCT window 12a, modulates the intensity of the light. Since the sample period in both of the opposing channels 16a and 16b are the same, those channels have equal and opposite modulation for a given current. Vibration induced modulation appears as equal modulation on both of the opposing channels 16a and 16b. Within the signal processing electronics, the output of the two opposing channels 16a and 16b are an input 18a and 18b to difference amplifier 18. Those inputs are subtracted from one another at difference amplifier 18 to thereby eliminate the vibration induced disturbance and the original signal recovered at the difference amplifier output 18c.

Referring now to FIG. 2, there is shown a block diagram for one of the identical channels 16a and 16b which for ease of description hereinafter will be identified as channel 16.

Channel 16 includes a switched integrator 20 which comprises the components inside of the box shown in FIG. 2. More particularly the integrator 20 has an integrating amplifier 22 one of whose inputs 22a is connected by a switch 51 to the junction of a PIN diode D1 and a resistor R1. Input 22a of amplifier 22 is connected by the parallel combination of a capacitor C1 and a switch S2 to the amplifier output 22b which is the output of integrator 20. The value of the capacitance of capacitor C1 determines the gain of the integrating amplifier 22.

The opening and closing of switches S1 and S2 is controlled by timing 24. The timing 24 also controls the driver 26 for light emitting diode (LED) D2 which acts as a constant current source of light. This constant current source of light allows each of channels 16a and 16b to operate at a maximum signal to noise ratio at all times regardless of the attenuation in the fiber optic loop.

The output 22b of integrator 20 is connected to a sample and hold circuit 28 the output of which is connected to the resistor R1 by an amplifier 30 which is used to remove any DC offset in the output of circuit 28. The output of circuit 28 is also connected to an analog divider 32 which also has an input from the output of amplifier 30. The analog divider 32 divides the output of circuit 28 by the output of amplifier 30. The signal present on the output of circuit 28 is the 'AC' signal that is being sensed. The output of amplifier 30 is the 'DC' signal. As the attenuation in the fiber loop is varied, both the 'AC' and 'DC' signals will vary proportionally. The function of the divider 32 is to divide the 'AC' signal by the 'DC' signal such that the output of the divider 32 is the same regardless of the fiber loop attenuation. The output of divider 32 is connected to one input of the two inputs 18a, 18b to difference amplifier 18 of FIG. 1.

The operation of channel 16 is as follows. When the channel 16 is sampling, the LED D2 is turned on for the channel's predetermined sample period. The light emitted from the LED diode is passed through the MOCT 12 in a direction that is associated with the particular channel 16a or 16b. As described above for FIG. 1, the light associated with channel 16a and the light associated with channel 16b are passed through the MOCT 12 in opposing directions. The current passing through MOCT window 12a modulates the light.

During the sample period, that is, when LED D2 is turned on, the modulated light is received by PIN diode D1 and is converted by the diode into an electrical signal. Also during the sample period, the timing 24 closes switch S1 and opens switch S2 to thereby allow a charge representative of the amplitude of the light received by diode D1 to accumulate across C1.

Upon the expiration of the sample period for channel 16, the switch S1 is opened and that causes the integrator 20 to hold its output at the voltage level determined by the charge accumulated in capacitor C1. The LED D2 is switched off and the voltage at the output of integrator 20 is transferred to the sample and hold circuit 28. At this point in time, both switches S1 and S2 are closed and the process described above can be repeated for the opposite channel. Therefore if the description given above is for channel 16a then once both switches S1 and S2 are closed, the LED D2 of channel 16b can be now be turned on and switch S1 of that channel is closed and switch S2 of that channel remains open to thereby allow a charge to accumulate on capacitor C1 in that channel.

In one embodiment of the present invention, switch integrator 20 was a Texas Instruments IVC102 chip and sample and hold circuit 28 and divider 32 were Analog Devices AD585 and AD734 chips.

Figure 3:
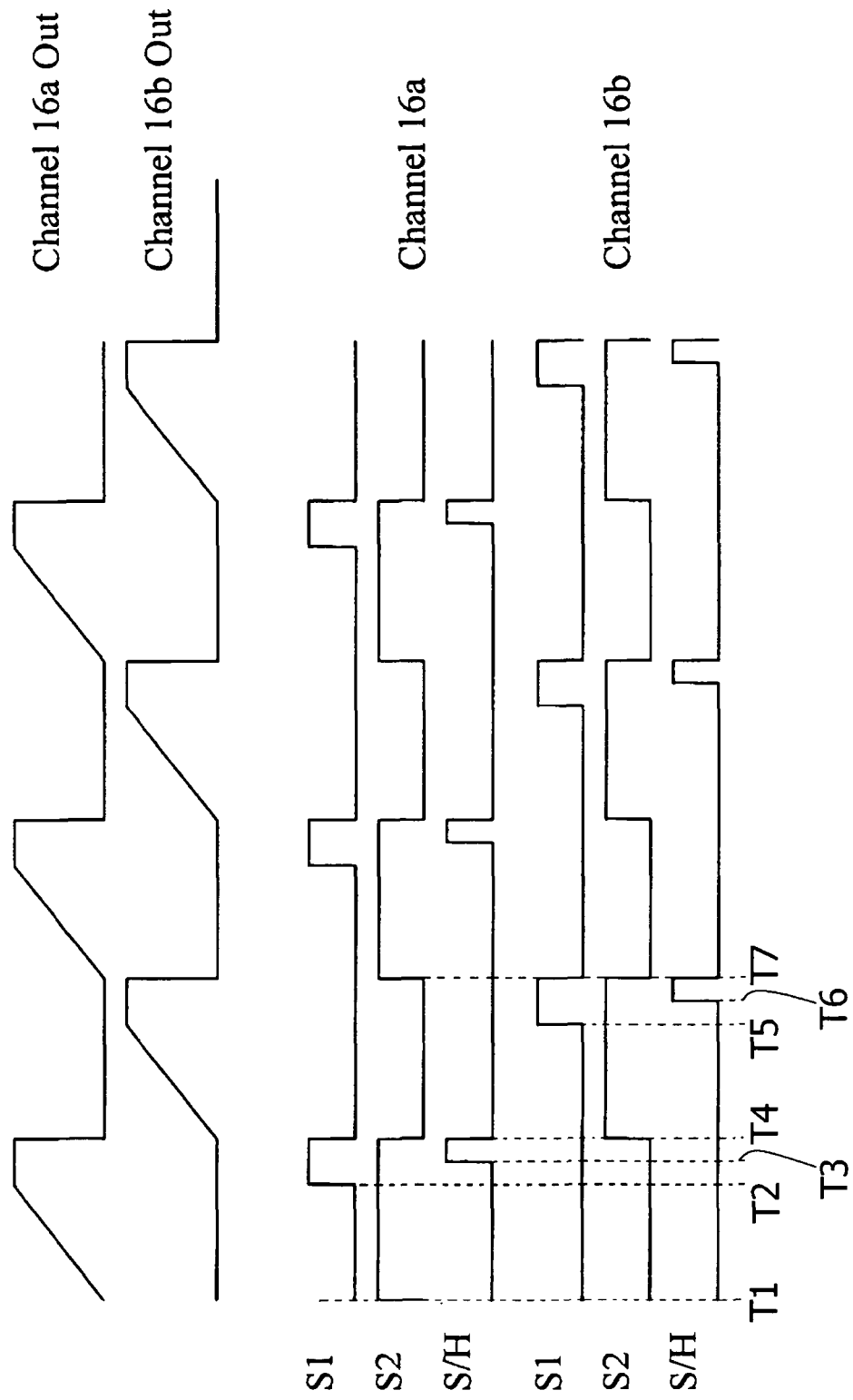
FIG. 3 shows the waveforms associated with each of the two identical channels in the system of the present invention.

Referring now to FIG. 3, there are shown the waveforms associated with the outputs of channels 16a and 16b and the switches S1 and S2 and the sample and hold circuit 28 in each of the channels. As can be seen in FIG. 3, at time T1 which is the beginning of the sample period for channel 16a, switch S1 in that channel is in a closed position and switch S2 is opened. During the sample period of channel 16a, that is from time T1 to time T2 the switches S1 and S2 of channel 16b are closed.

At time T2, which is the end of the sampling period for channel 16a, switch S1 is opened and is held open until time T4 at which time it is closed. Sample and hold circuit 26 of channel 16a obtains the sample from integrator 20 of channel 16a during the time period T3 to T4. At time T4 which is the beginning of the sample period for channel 16b, switch S2 of channel 16b is opened and switch S1 of that channel which was previously closed remains closed. At time T5, the sample period of channel 16b ends and switch S1 of that channel is opened. Sample and hold circuit 26 of channel 16b obtains the sample from integrator 20 of channel 16b during the time period T6 to T7. It should be noted that switches S1 and S2 of channel 16a remain closed during the time period from T4 to T7 and at time T7 switch S2 of channel 16a closed so that channel 16a can start its next sample period.

It should be appreciated that a channel 16 embodied in accordance with the present invention substantially eliminates back-reflections of light by holding switches S1 and S2 of the channel 16a or 16b that has completed its sample period closed during the sample period of the other channel 16b or 16a whose light is passing through the MOCT 12 in a direction opposite to the direction of light passage through the MOCT 12 for the channel that has just completed its sample period. By holding the switches S1 and S2 closed for the channel that has completed its sample period no charge can accumulate on that channel's capacitor C1. As described above, the capacitance of capacitor C1 determines the gain of the integrating amplifier 20 and holding the switches S1 and S2 closed substantially reduces that gain and thus substantially eliminates the effect of back-reflections of light in that channel.

It should also be appreciated that the sample and hold circuit 28 isolates the channel 16a or 16b that has just completed its sample period from the back-reflected light and ensures that the sample from that channel remains valid during the duration of the opposing channel's 16b or 16a sample period.

It should further be appreciated that since the integrating amplifier 20 in each channel 16a and 16b samples the light from the MOCT 12 for the entire duration of the sample period the integrating amplifier 22 serves as a low pass filter that is part of the detector. It should also be further appreciated that because of the integrating amplifier 22 the signal transitions in the detector are relatively slow and this reduces the switching transients in the system.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A system for monitoring an alternating current comprising:
   a magneto-optical current transducer adapted to modulate an optical signal corresponding to the magnitude of the alternating current, said transducer includes a first output and a second output and a first input and a second input;
   a first and a second beam splitter being in communication with said first and said second output respectively;
   a first and a second channel being in communication with said first and said second beam splitter respectively; said first channel including a first LED and said second channel including a second LED, said first LED in communication with said second beam splitter and said second LED in communication with said first beam splitter, said first channel including a first output and said second channel including a second output;

a difference amplifier connected to said first and said second channel outputs to subtract said first and said second channel outputs from one another to eliminate vibration induced disturbance, and outputting a subtracted signal at an amplifier output; and wherein said first and said second LEDs are powered by a constant current source.

2. The system of claim 1 wherein each said channel includes an integrator circuit and a sample and hold circuit, said integrator circuit collecting a sample charge proportional to the magnitude of the alternating current over a sample period and said sample and hold circuit connected to said integrator circuit and holding said sample charge during the duration of the other of said first or said second channel sample period.

3. The system of claim 2, wherein each said channel further includes a PIN diode for receiving a light signal from said splitter and a first resistor connected to said PIN diode at a junction, said integrator circuit including an input connected to said junction.

4. The system of claim 3, wherein each said channel further includes an amplifier and an analog divider, said sample and hold circuit including an output connected to said amplifier and to said analog divider, said amplifier including an output connected to a second junction, said second junction also connected to said resistor and said analog divider.

5. The system of claim 3 wherein said analog divider divides the output of said sample and hold circuit by the output of said amplifier and outputs a divided signal to said difference amplifier.

6. A system for monitoring an alternating current comprising:

a magneto-optical current transducer adapted to modulate an optical signal corresponding to the magnitude of the alternating current, said transducer includes a first output and a second output and a first input and a second input;

a first and a second beam splitter being in communication with said first and said second output respectively;

a first and a second channel being in communication with said first and said second beam splitter respectively; said first channel including a first LED and said second channel including a second LED, said first LED in communication with said second beam splitter and said second LED in communication with said first beam splitter, said first channel including a first output and said second channel including a second output, each said channel includes an integrator circuit and a sample and hold circuit, said integrator circuit collecting a sample charge proportional to the magnitude of the alternating current over a sample period and said sample and hold circuit connected to said integrator circuit and holding said sample charge during the duration of the other of said first or said second channel sample period;

a difference amplifier connected to said first and said second channel outputs to subtract said first and said second channel outputs from one another to eliminate vibration induced disturbance, and outputting a subtracted signal at an amplifier output.

7. The system of claim 6 wherein said first and said second LEDs are powered by a constant current source.

8. The system of claim 6 wherein each said channel further includes a PIN diode for receiving a light signal from said splitter and a first resistor connected to said PIN diode at a junction, said integrator circuit including an input connected to said junction.

9. The system of claim 8, wherein each said channel further includes an amplifier and an analog divider, said sample and hold circuit including an output connected to said amplifier and to said analog divider, said amplifier including an output connected to a second junction, said second junction also connected to said resistor and said analog divider.

10. The system of claim 9 wherein said analog divider divides the output of said sample and hold circuit by the output of said amplifier and outputs a divided signal to said difference amplifier.

* * * * *

UNITED STATES PATENT AND TRADEMARK OFFICE
CERTIFICATE OF CORRECTION

| | |
|---|---|
| PATENT NO. | : 8,525,511 B2 |
| APPLICATION NO. | : 12/517899 |
| DATED | : September 3, 2013 |
| INVENTOR(S) | : Robert M. Snyder et al. |

It is certified that error appears in the above-identified patent and that said Letters Patent is hereby corrected as shown below:

Title page, item [12] under United States Patent – Synder et al. should read as follows: Snyder et al.

Signed and Sealed this
Twenty-fourth Day of December, 2013

Margaret A. Focarino
*Commissioner for Patents of the United States Patent and Trademark Office*

UNITED STATES PATENT AND TRADEMARK OFFICE
CERTIFICATE OF CORRECTION

PATENT NO. : 8,525,511 B2  Page 1 of 1
APPLICATION NO. : 12/517899
DATED : September 3, 2013
INVENTOR(S) : Robert M. Snyder et al.

It is certified that error appears in the above-identified patent and that said Letters Patent is hereby corrected as shown below:

Title page, item [12] under United States Patent – Synder et al. should read as follows: Snyder et al.

Title Page, item [75] Inventor, line 1, "Robert M. Synder" should read --Robert M. Snyder--.

This certificate supersedes the Certificate of Correction issued December 24, 2013.

Signed and Sealed this
Fourth Day of February, 2014

Michelle K. Lee
*Deputy Director of the United States Patent and Trademark Office*